(12) United States Patent
Feng et al.

(10) Patent No.: US 7,763,918 B1
(45) Date of Patent: Jul. 27, 2010

(54) IMAGE PIXEL DESIGN TO ENHANCE THE UNIFORMITY OF INTENSITY DISTRIBUTION ON DIGITAL IMAGE SENSORS

(76) Inventors: Chen Feng, 12144 NE. 170th Pl., Bothell, WA (US) 98011; Jim Li, 1410 Sturgeon Way, San Jose, CA (US) 95129

(*) Notice: Subject to any disclaimer, the term of this patent is extended or adjusted under 35 U.S.C. 154(b) by 547 days.

(21) Appl. No.: 11/004,376

(22) Filed: Dec. 2, 2004

(51) Int. Cl.
*H01L 31/18* (2006.01)
*H01L 31/06* (2006.01)
*H01L 21/00* (2006.01)
*G06F 17/50* (2006.01)

(52) U.S. Cl. .................. 257/292; 257/432; 257/443; 257/E21.536; 257/E31.127; 438/73; 716/19

(58) Field of Classification Search .......... 257/292, 257/432, 443, E21.536, E31.127; 438/73; 716/19
See application file for complete search history.

(56) References Cited

U.S. PATENT DOCUMENTS

| | | | |
|---|---|---|---|
| 4,739,394 A | | 4/1988 | Oda et al. |
| 5,142,357 A | | 8/1992 | Lipton et al. |
| 5,323,052 A | * | 6/1994 | Koyama ............. 257/432 |
| 5,324,930 A | * | 6/1994 | Jech, Jr. ............. 250/216 |
| 5,422,285 A | * | 6/1995 | Ishibe ................ 438/69 |
| 5,659,357 A | | 8/1997 | Miyano |
| 5,798,847 A | | 8/1998 | Aerts |
| 5,838,023 A | | 11/1998 | Goel et al. |
| 6,008,511 A | * | 12/1999 | Tokumitsu et al. ..... 257/232 |
| 6,246,043 B1 | | 6/2001 | Merrill |
| 6,274,917 B1 | * | 8/2001 | Fan et al. ............. 257/432 |
| 6,411,331 B1 | | 6/2002 | Sansom-Wai et al. |
| 6,437,307 B1 | | 8/2002 | Bloss |
| 6,747,808 B2 | | 6/2004 | Voss et al. |
| 6,781,632 B1 | * | 8/2004 | Ide ..................... 348/345 |
| 6,838,715 B1 | * | 1/2005 | Bencuya et al. ....... 257/291 |

(Continued)

FOREIGN PATENT DOCUMENTS

WO    WO 2004/027875    4/2004

OTHER PUBLICATIONS

Office Action issued in U.S. Appl. No. 11/314,452, mailed Dec. 22, 2008.

(Continued)

*Primary Examiner*—Evan Pert
(74) *Attorney, Agent, or Firm*—McAndrews, Held & Malloy Ltd.

(57) ABSTRACT

A system, a computer readable medium, and a method for configuring metal layout of a pixel in a sensor die to enhance the intensity uniformity of an image captured by the sensor die. The method includes the steps of selecting an edge pixel of a sensor die, providing a distance between a photodiode and a metal layer of the selected pixel, shifting a microlens of the edge pixel toward center of the sensor die to maximize ray acceptance angle of the edge pixel, determining a portion of a plane defined by the metal layer, wherein light collected by the photodiode passes through the portion, and configuring the metal layer outside of the determined portion such that the interference of the metal layer with the optical ray is eliminated and, as a consequence, intensity uniformity of an image captured by the sensor die is enhanced.

19 Claims, 14 Drawing Sheets

U.S. PATENT DOCUMENTS

| | | | |
|---|---|---|---|
| 6,884,985 | B2 | 4/2005 | Raynor |
| 6,903,391 | B2 * | 6/2005 | Takeuchi et al. ............. 257/233 |
| 6,995,800 | B2 * | 2/2006 | Takahashi et al. ........... 348/340 |
| 7,006,135 | B2 | 2/2006 | Ishimaru et al. |
| 7,019,279 | B2 * | 3/2006 | Oda et al. ................... 250/216 |
| 7,049,168 | B2 * | 5/2006 | Findlater et al. ............... 438/69 |
| 7,161,129 | B2 * | 1/2007 | Galambos et al. ........ 250/208.1 |
| 7,236,190 | B2 | 6/2007 | Yanof et al. |
| 2001/0036305 | A1 | 11/2001 | Jun |
| 2001/0056337 | A1 | 12/2001 | Kurita |
| 2003/0006363 | A1 * | 1/2003 | Campbell et al. ........ 250/208.1 |
| 2003/0011686 | A1 | 1/2003 | Higuchi |
| 2003/0071271 | A1 * | 4/2003 | Suzuki et al. ................ 257/98 |
| 2003/0173599 | A1 | 9/2003 | Nakai |
| 2004/0135899 | A1 | 7/2004 | Suemoto |
| 2004/0140564 | A1 | 7/2004 | Lee et al. |
| 2004/0165097 | A1 * | 8/2004 | Drowley et al. ............. 348/340 |
| 2005/0010621 | A1 | 1/2005 | Pinto et al. |
| 2005/0061951 | A1 * | 3/2005 | Campbell et al. ........ 250/208.1 |
| 2005/0122408 | A1 | 6/2005 | Park et al. |
| 2005/0174473 | A1 | 8/2005 | Morgan et al. |
| 2006/0006438 | A1 * | 1/2006 | Maruyama ................. 257/294 |
| 2006/0113622 | A1 | 6/2006 | Adkisson et al. |

OTHER PUBLICATIONS

Office Action issued in U.S. Appl. No. 11/314,452, mailed Jun. 30, 2006.

Office Action issued in U.S. Appl. No. 11/314,452, mailed Jan. 5, 2007.

Office Action issued in U.S. Appl. No. 11/314,452, mailed Aug. 9, 2007.

Office Action issued in U.S. Appl. No. 11/314,452, mailed Mar. 17, 2008.

Office Action issued in U.S. Appl. No. 11/003,824, mailed Dec. 12, 2007.

Office Action issued in U.S. Appl. No. 11/004,465, mailed Mar. 28, 2006.

Office Action issued in U.S. Appl. No. 11/004,465, mailed Aug. 28, 2006.

Office Action issued in U.S. Appl. No. 11/004,465, mailed Jan. 25, 2007.

Office Action issued in U.S. Appl. No. 11/004,465, mailed Jan. 11, 2008.

Office Action issued in U.S. Appl. No. 11/004,465, mailed Jun. 2, 2008.

Office Action issued in U.S. Appl. No. 10/976,693, mailed Oct. 18, 2007.

Nikon, AF Micro-Nikkor 60mm f/2.8D 1993, Release: http://nikonimaging.com/global/products/lens/af/micro/af_micro60mmf_28d/index.htm.

Office Action issued in U.S. Appl. No. 10/976,693, mailed Jun. 11, 2008.

Notice of Allowance issued in U.S. Appl. No. 11/003,824 mailed Jul. 15, 2008.

Office Action issued in U.S. Appl. No. 11/004,465, mailed Oct. 2, 2008.

Notice of Allowance issued in U.S. Appl. No. 11/313,976, mailed Mar. 24, 2009.

* cited by examiner

IMAGE PIXEL DESIGN TO ENHANCE THE UNIFORMITY OF INTENSITY DISTRIBUTION ON DIGITAL IMAGE SENSORS

BACKGROUND

1. Field of the Invention

Invention relates to CMOS image sensor design and more particularly to image pixel design of CMOS image sensors.

2. Background of the Related Art

There has been an increase of digital image devices using CMOS image sensors. Typically, a CMOS image sensor may be a sensor die that is a piece of silicon and includes an integrated circuit (IC) to function as an image sensor. A conventional sensor die comprises a processing area and a sensing area that may have from several hundred thousands to millions of identical sensor pixels. Hereinafter, for simplicity, the sensor die (or, equivalently CMOS image sensor) refers to its sensing area only.

In general, CMOS image sensor manufacturers test the intensity distribution of the sensor die using a uniform parallel light source. In this case, each pixel collects the uniform amount of optical signal at a fixed angle. Thus, a defective pixel can be identified by comparing the output signal from each pixel with those from its neighboring pixels, as the defective pixel would generate an unusual output signal.

However, a conventional image device with healthy pixels still can yield non-uniform images, which may be rooted in other sources, such as imaging lens. A conventional image sensor device has an imaging lens that forms an image to the sensor device in which pixels collect optical signals at different ray acceptance angles. Consequently, if the pixel layout is configured to have angular dependency on the ray acceptance angle, the output from pixels can be non-uniform as a function of the ray acceptance angle. Such non-uniformity may yield the non-uniform intensity pattern of the image even though the sensor die comprises healthy pixels. Thus, there is a need for image sensors with improved pixel layout design and pixel arrangements to enhance the uniformity of intensity distribution on digital images captured by the image sensors.

SUMMARY

The present invention provides image sensor devices with improved metal layout design to enhance the uniformity of intensity distribution on digital images captured by the image sensor devices.

In one aspect of the present invention, a method for configuring a metal layer of a pixel in a sensor die includes steps of: shifting a microlens of an edge pixel of a sensor die toward a center of the sensor die to maximize a ray acceptance angle of the edge pixel; laying out a portion of a plane parallel to a photodiode of the edge pixel, all of optical rays collected by the microlens passing through the portion; and configuring a metal layer on the plane outside of the portion.

In another aspect of the present invention, a computer readable medium carries one or more sequences of instructions for configuring a metal layer of a pixel in a sensor die, wherein execution of the one or more sequences of instructions by one or more processors causes the one or more processors to perform the steps of: shifting a microlens of an edge pixel of a sensor die toward a center of the sensor die to maximize a ray acceptance angle of the edge pixel; laying out a portion of a plane parallel to a photodiode of the edge pixel, all of optical rays collected by the microlens passing through the portion; and configuring a metal layer on the plane outside of the portion.

In yet another aspect of the present invention, a system for configuring a metal layout of a pixel in a sensor die includes: means for shifting a microlens of an edge pixel of a sensor die toward a center of the sensor die to maximize a ray acceptance angle of the edge pixel; means for laying out a portion of a plane parallel to a photodiode of the edge pixel, all of optical rays collected by the microlens passing through the portion; and means for configuring a metal layer on the plane outside of the portion.

In still another aspect of the present invention, an imaging device includes: a sensor die, comprising: a processing area; and a sensing area, comprising: a plurality of sensor pixels, each of the plurality of sensor pixels comprising: a silicon substrate having a photodiode and a plurality of passive components; a first insulating layer on top of the silicon substrate; a plurality of metal layers on top of the first insulating layer, the photodiode and the plurality of passive components connected to at least one of the plurality of metal layers; a plurality of middle insulating layers, each of the plurality of middle insulating layers sandwiched between two neighboring ones of the plurality of insulating layers; a first insulating planar layer on top of the plurality of metal layers; a color filter; a second insulating planar layer on top of the color filter; and a microlens to direct incoming light to the photodiode through the color filter, wherein the plurality of metal layers are configured such that the plurality of metal layers do not block the incoming light.

In another aspect of the present invention, a method for arranging a plurality of identical pixels on a sensor die includes the steps of: providing a rectangular sensor die; and arranging a plurality of identical pixels on the sensor die in a matrix form, each of the plurality of identical pixels including a polygonal photodiode, wherein a longest side of the polygonal photodiode is in parallel with a longer side of the rectangular sensor die.

In another aspect of the present invention, a computer readable medium carries one or more sequences of instructions for arranging a plurality of identical pixels on a sensor die, wherein execution of the one or more sequences of instructions by one or more processors causes the one or more processors to perform the steps of: providing a rectangular sensor die; and arranging a plurality of identical pixels on the sensor die in a matrix form, each of the plurality of identical pixels including a polygonal photodiode, wherein a longest side of the polygonal photodiode is in parallel with a longer side of the rectangular sensor die.

In another aspect of the present invention, a system for arranging a plurality of identical pixels on a sensor die includes: means for providing a rectangular sensor die; and means for arranging a plurality of identical pixels on the sensor die in a matrix form, each of the plurality of identical pixels including a polygonal photodiode, wherein a longest side of the polygonal photodiode is in parallel with a longer side of the rectangular sensor die.

In another aspect of the present invention, a method for configuring an image size captured by a microlens of a pixel in a sensor die includes the steps of: determining a distance between a photodiode and a microlens of a pixel; and maximizing a size of an image captured by the microlens, wherein the image remains within the photodiode.

In another embodiment of the present invention, a sensor pixel includes: a silicon substrate having a photodiode and a plurality of passive components; a first insulating layer on top of the silicon substrate; a plurality of metal layers on top of the first insulting layer, the photodiode and the plurality of passive components connected to at least one of the plurality of metal layers; one or more middle insulating layers, each of the one or more middle insulating layers sandwiched between two neighboring ones of the plurality of metal layers; and a microlens to direct incoming light to the photodiode; wherein an entire portion of the incoming light is collected by the photodiode.

In another embodiment of the present invention, an imaging device includes: a sensor die for digital imaging, comprising: a processing area; and a sensing area, comprising: a plurality of sensor pixels, each of the plurality of sensor pixels comprising: a silicon substrate having a photodiode and a plurality of passive components; a first insulating layer on top of the silicon substrate; a plurality of metal layers on top of the first insulating layer, the photodiode and the plurality of passive components connected to at least one of the plurality of metal layers; one or more middle insulating layers, each of the one or more middle insulating layers sandwiched between two neighboring ones of the plurality of metal layers; and a microlens to direct incoming light to the photodiode; wherein an entire portion of the incoming light is collected by the photodiode.

In another embodiment of the present invention, a method for preparing a sensing area of an imaging device includes steps of: forming a plurality of sensor pixels on the sensing area, said step of forming a plurality of sensor pixels comprising: providing a substrate; forming a plurality of a photodiode and a plurality of passive components on the substrate; forming a first insulating layer on top of the substrate; forming a plurality of metal layers on top of the first insulating layer, each of the plurality of photodiodes and each of the plurality of passive components connected to at least one of the plurality of metal layers; forming one or more middle insulating layers, each of the one or more middle insulating layers sandwiched between two neighboring ones of the plurality of metal layers; and forming an array of microlenses to direct incoming light to the plurality of photodiodes, wherein an entire portion of the incoming light is collected by the plurality of photodiodes.

These and other features, aspects and advantages of the present invention will become better understood with reference to the following drawings, description and claims.

DETAILED DESCRIPTION

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

It must be noted that, as used herein and in the appended claims, the singular forms "a", "an", and "the" include plural referents unless the context clearly dictates otherwise. Thus, for example, reference to "a microlens" includes a plurality of such microlens, i.e., microlens array, and equivalents thereof known to those skilled in the art, and so forth.

One common practice of CMOS sensor customization is shifting a microlens array of the sensor to match incident rays at large angles. However, in the application of the shifting technique, the non-symmetric nature of the CMOS sensor layout may create non-symmetric brightness distribution over the image output, where the non-symmetric nature may be more pronounced at the corners and edges of the image output. In addition, such non-symmetric brightness may be accompanied by improper color balance, i.e., the color of the image of a white light source is not white over the entire image output. The present inventor provides a simple, yet effective way to resolve the appearance of non-symmetric brightness in the image by introducing off-center alignment between a microlens array and a sensor pixel array of the CMOS sensor.

Figure 1:
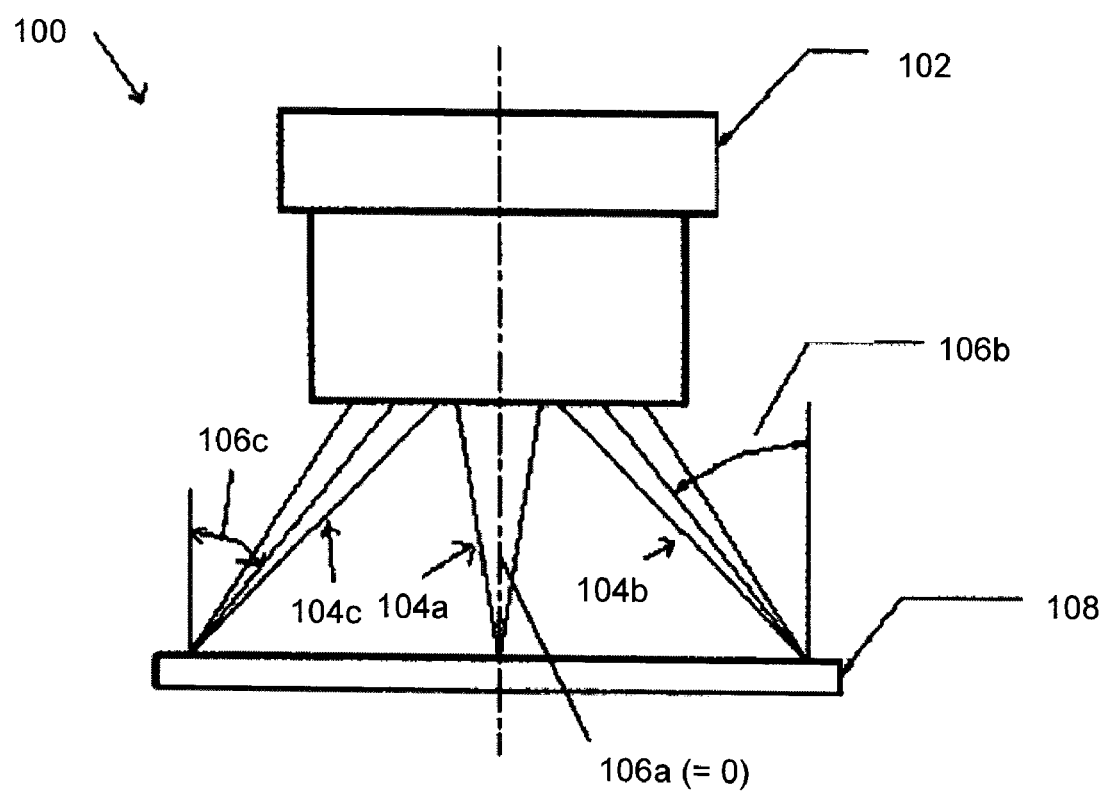
FIG. 1 is a schematic diagram of an image module assembly in accordance with one embodiment of the present teachings.

FIG. 1 is a schematic diagram of an image module assembly 100 (or, equivalently a lens/sensor assembly) in accordance with one embodiment of the present teachings. The lens/sensor assembly 100 may be included in digital image devices, such as digital image camera and cellular phone with imaging capabilities. As illustrated, the lens/sensor assembly 100 includes: a sensor die 108 as an image sensor; and a lens assembly 102 having several pieces of lenses and iris (not shown in FIG. 1 for simplicity) assembled in a lens barrel, the lens assembly forming an image on the surface of the sensor die 108. In one embodiment, the width and length of the sensor die 108 is about, but not limited to, 5 mm.

Optical rays 104a-c, exemplary optical rays from the lens assembly 102, are directed to sensor pixels (the sensor pixels will be explained later) at the center, near the left edge and near the right edge of the sensor die 108, respectively, and angled with respect to the surface normal of the sensor die 108 by chief ray angles 106a-c, respectively. The chief ray angles 106b and 106c may be as large as 30 degrees, while the chief ray angle 106a is about zero degree.

Figure 2C:
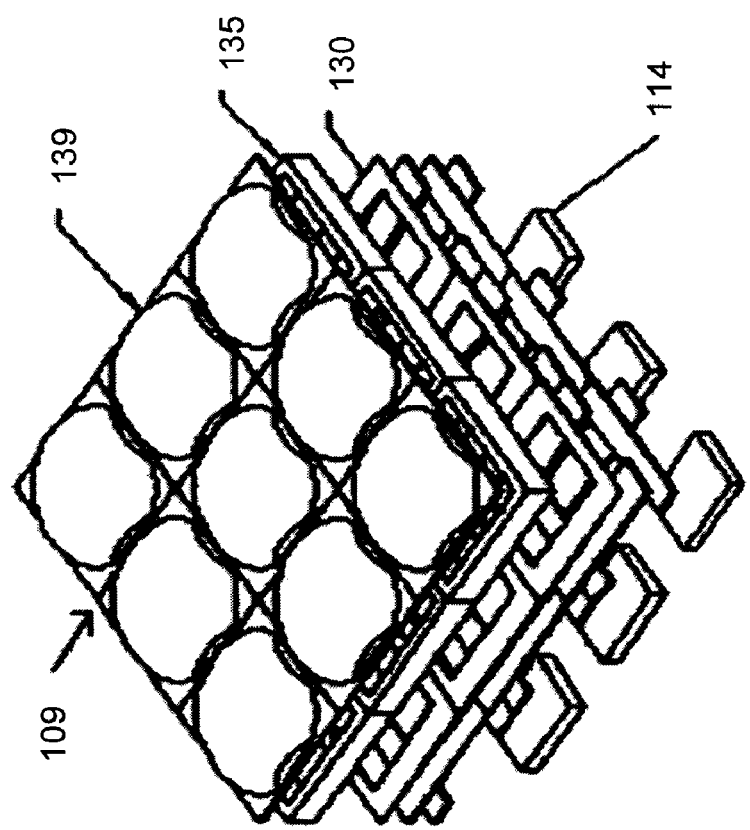
FIGS. 2B, 2C and 2D are a front, perspective and side view of the portion in FIG. 2A, respectively
Figure 2A:
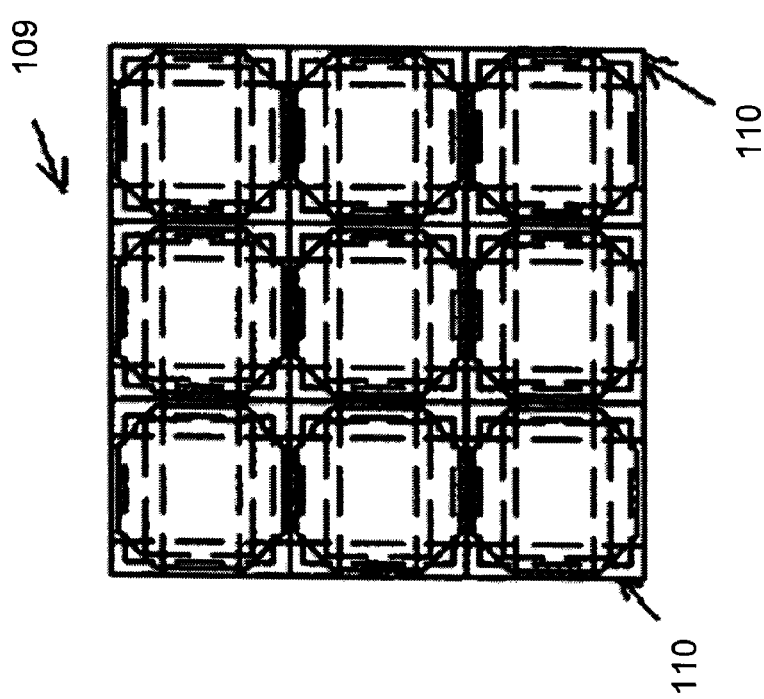
FIG. 2A is a top view of a portion of a silicon die in accordance with one embodiment of the present teachings.
Figure 2B:
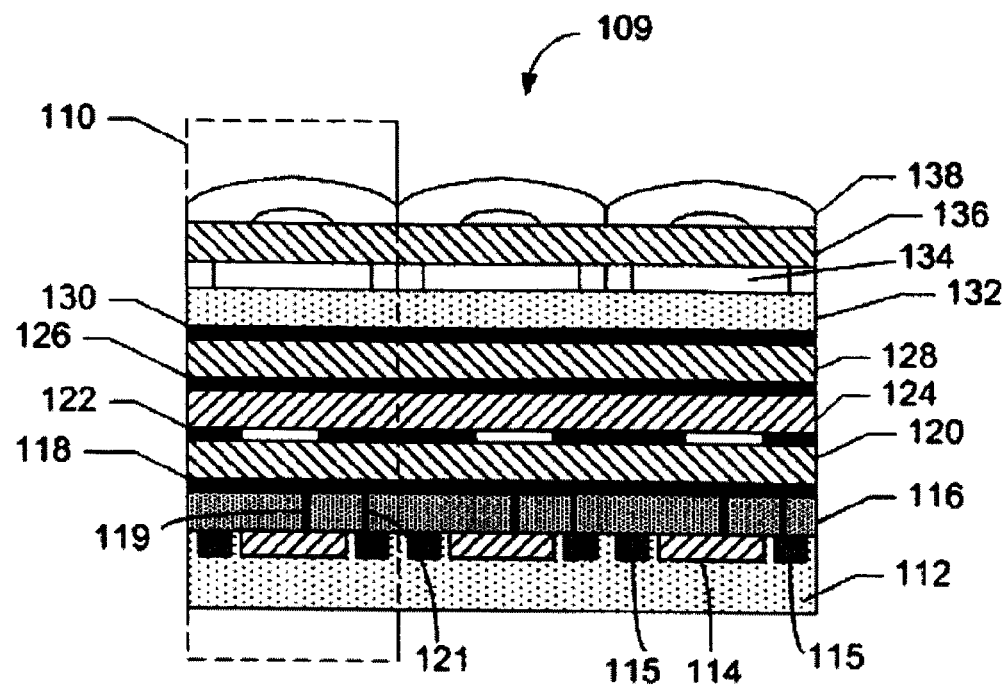
Figure 2D:
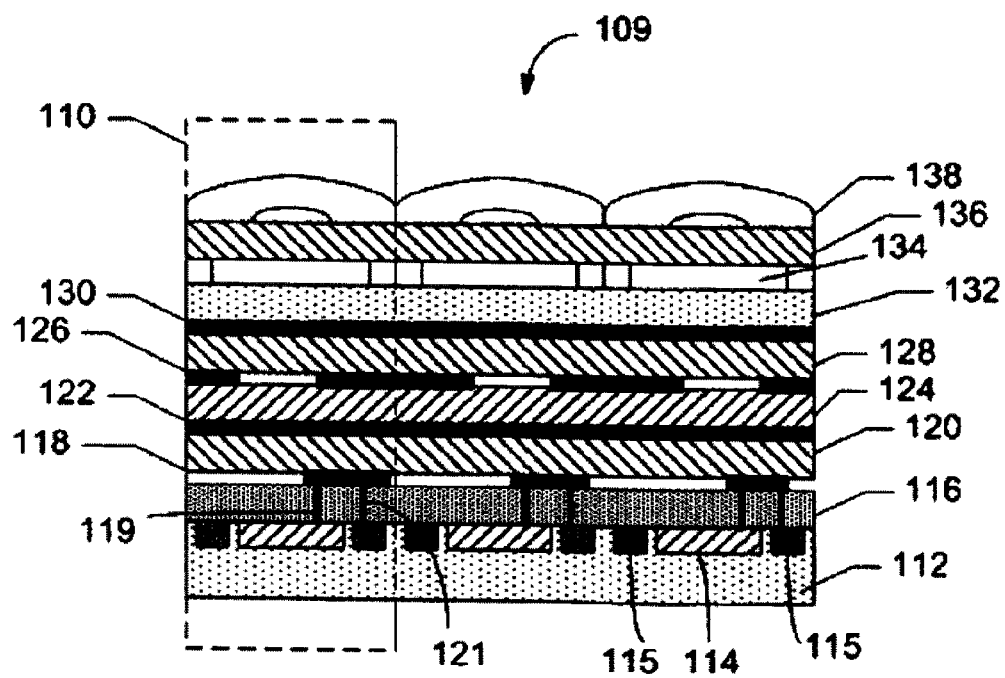

The sensor die 108, a type of CMOS image sensor, is a piece of silicon that includes an integrated circuit (IC) to function as an image sensor. The IC comprises a processing area and a sensing area that may have from several hundred thousands to millions of identical sensor pixels. Hereinafter, for simplicity, the sensor die 108 refers to its sensing area only. FIG. 2A is a top view of a portion 109 of the silicon die 108 in accordance with one embodiment of the present teachings, where only 9 sensor pixels 110 are shown for simplicity. FIGS. 2B and 2D are the front and side views of the portion 109 in FIG. 2A, respectively, showing multiple layers 112-138 of the silicon die 108. FIG. 2C is a perspective view of the portion 109 in FIG. 2A, focusing on several key features of the layers.

As shown in FIGS. 2B-2D, each pixel 110 includes: a silicon substrate layer 112; a photodiode 114 forming a portion of and being underneath the surface of the silicon substrate layer 112; a plurality of passive components 115 (such as transistors, resistors and capacitors) underneath the surface of the silicon substrate layer 112; four transparent insulating layers 116, 120, 124 and 128; four metal layers 118, 122, 126 and 130, the four metal layers being insulated by the four transparent insulating layers 116, 120, 124 and 128, and connected to the photodiode 114 and/or the plurality of passive elements 115; a first planar layer 132, the first planar layer being a transparent insulating layer and having a flat top surface; a color filter 134 for passing a specific wavelength or wavelength band of light to the photodiode 114; and a microlens 138 for focusing light rays to the photodiode 114. A microlens array 139 in FIG. 2C comprises the identical microlens 138.

In one embodiment of the present teachings, the photodiode 114 and the plurality of passive elements 115 may be formed by a semiconductor etching process, i.e., etching the surface of the silicon substrate layer 112 and chemically depositing intended types of material on the etched area to form the photodiode 114 and the plurality of passive elements 115.

As mentioned, the color filter 134 filters light rays (such as 104 in FIG. 1) directed to its corresponding photodiode 114 and transmits light rays of only one wavelength or wavelength band. In one embodiment of the present teachings, a RGB color system may be used, and consequently, a color filter array (CFA) 135 (shown in FIG. 2C) comprises three types of filters 134. In the RGB system, signals from three pixels are needed to form one complete color. However, it is noted that the number of types of filters in the CFA 135 can vary depending on the color system applied to the silicon die 108.

The metal layers 118, 122, 126 and 130 function as connecting means for the photodiodes 114 and passive components 115 to the processing area of the silicon die 108, where the signals from the photodiodes and passive components are transmitted using a column transfer method. In FIGS. 2c and 2d, for the purpose of illustration, exemplary connections 119 and 121 are shown, where the connections 119 and 121 link the metal layer 118 to the photodiode 114 and one the of passive components 115, respectively. However, it should be apparent to one of ordinary skill that connections between the four metal layers (118, 122, 126 and 130) and the photodiode 114 and the passive components 115 can vary depending on the overall layout of the silicon die 108. Also, the number of metal layers depends on the complexity of the layout of metal layers and, as a consequence, a different layout of the silicon die may have a different number of metal layers.

Figure 3A:
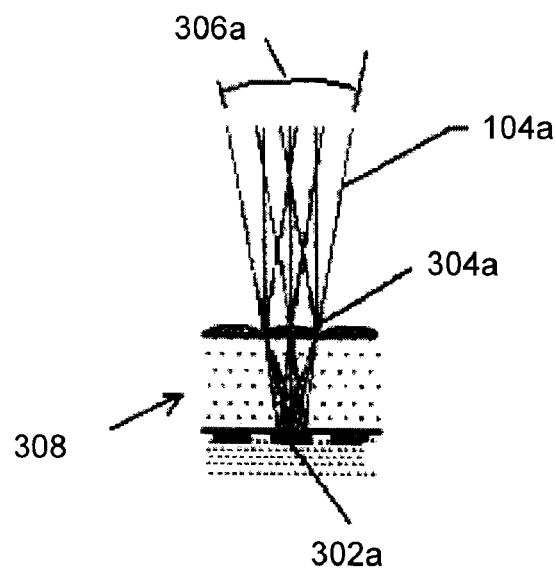
FIGS. 3A and 3B illustrate ray acceptance angles for a sensor with a non-shifted microlens array.
Figure 3B:
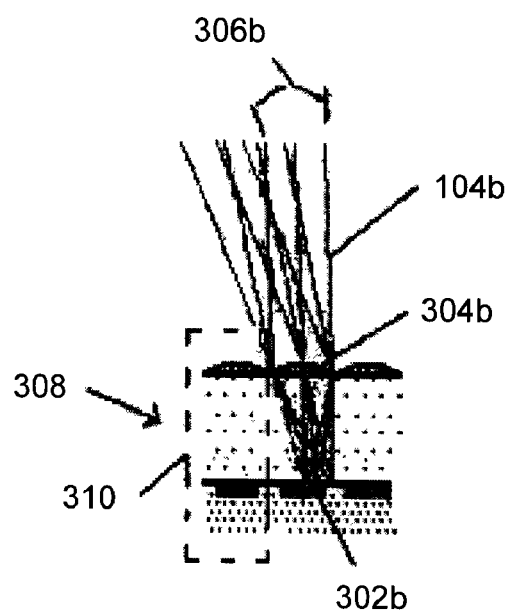
Figure 4:
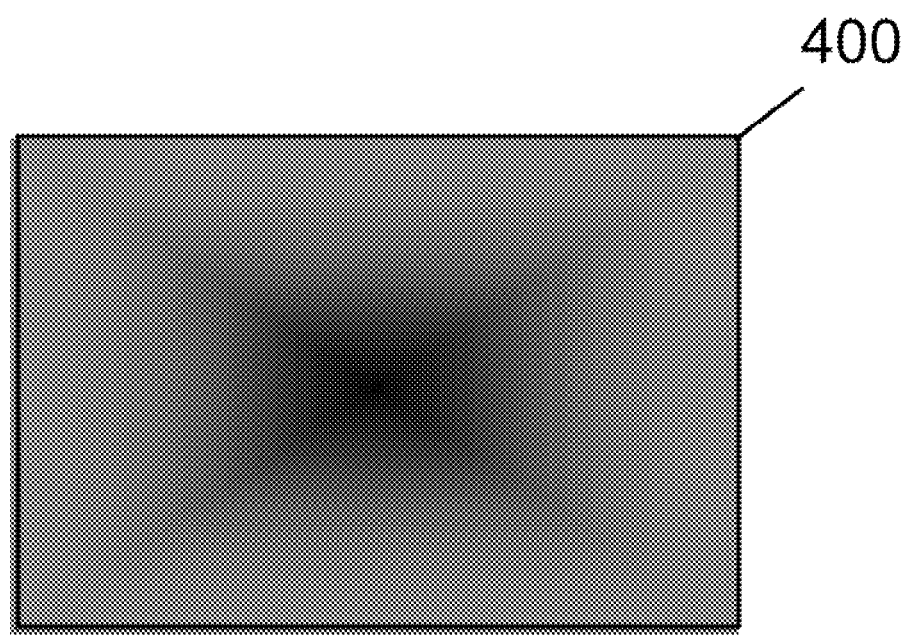
FIG. 4 is an image of a white light source captured by an image sensor having a sensor die, where the brightness of the image is non-uniform across the sensor die.

As illustrated in FIG. 1, each of the optical rays 104a-c is angled with respect to the surface normal of the sensor die 108. FIGS. 3A and 3B illustrate ray acceptance angles 306 for a sensor die 308 with a non-shifted microlens array 304, where the optical axis of a microlens in each pixel 310 coincides with the optical axis of a photodiode 302 in the pixel. (Hereinafter, the optical axis of a photodiode refers to an axis normal to the surface of the photodiode and passes through the geometric center of the photodiode.) In FIGS. 3A-3B, for simplicity, only photodiodes 302 and a microlens array 304 are shown. As illustrated in FIG. 3A, most of the light rays 104a are collected by a photodiode 302a that is located at the center of the sensor die 308. Thus, the light ray acceptance angle 306a is the same as that of incoming light rays 104a. In contrast, as shown in FIG. 3B, some portion of the optical rays 104b are not collected by a photodiode 302b that is located near the right edge of the silicon die 308, i.e., the photodiode 302b has a limited ray acceptance angle 306b. Such limited ray acceptance angle may result in non-uniform brightness distribution of an image on the sensor die 308, as shown in FIG. 4. FIG. 4 shows an image 400 of a white light source captured by an image sensor having the sensor die 308, where the brightness of image 400 is non-uniform across the sensor die 308, where the brightness of image 400 is non-uniform across the sensor die 308. In addition, the image 400 may not be color balanced, i.e., the color of the image is not white over the entire sensor die.

Figure 5A:
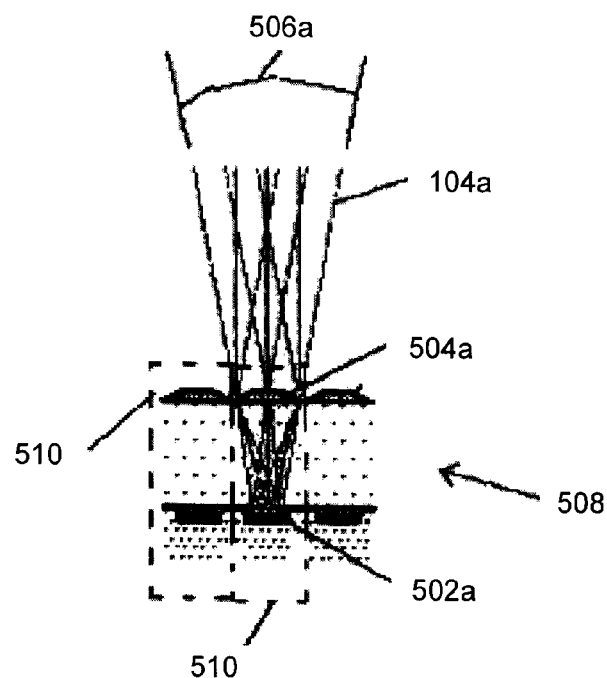
FIGS. 5A and 5B illustrate ray acceptance angles for a sensor with a shifted microlens array in accordance with one embodiment of the present teachings.
Figure 5B:
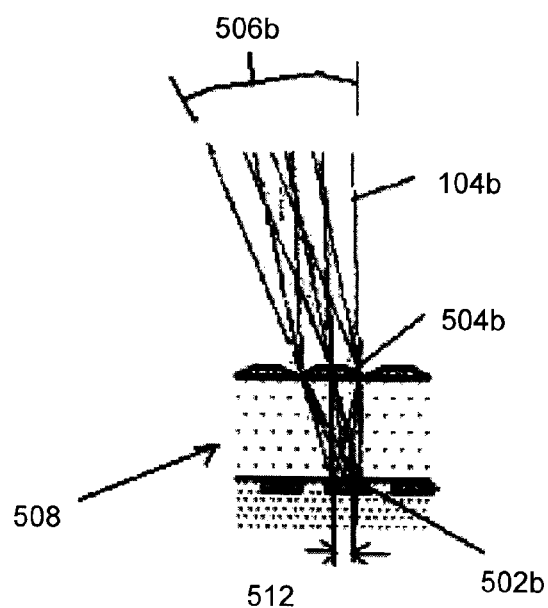

FIGS. 5A and 5B illustrate ray acceptance angles 506 for a sensor die 508, where the optical axis of a microlens 504 in each pixel 510 has been shifted with respect to the optical axis of a photodiode 502 of the pixel in accordance with one embodiment of the present teachings. In FIG. 5A, the optical axis of a microlens 504a in a pixel coincides with the optical axis of a photodiode 502a of the same pixel, where the pixel is located at the center of the sensor die 508. However, as shown in FIG. 5B, the optical axis of a microlens 504b in a pixel located near the right edge of the sensor die 508 has been shifted by a distance 512 with respect to the optical axis of a photodiode 502b in an effort to improve the ray acceptance angle 506b. The light ray acceptance angles 506a and 506b are equal to those of the incoming light rays 104a and 104b, respectively.

Figure 6:
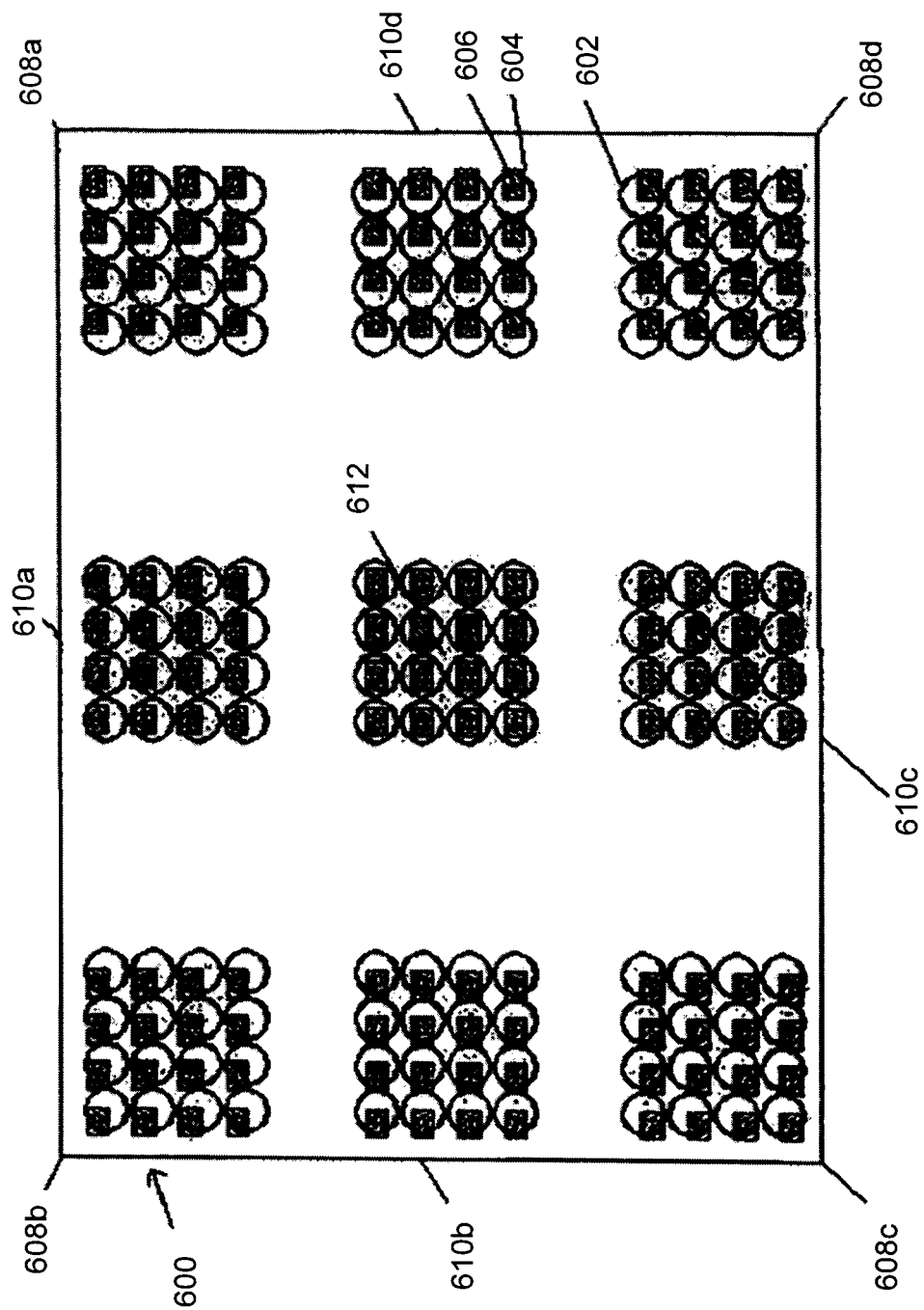
FIG. 6 is a top view of a sensor die with a microlens array, elements of which are shifted to achieve ray angle match over the entire sensor die in accordance with one embodiment of the present teachings.

FIG. 6 is a top view of a sensor die 600 with a microlens array 602, the elements of which are shifted to achieve ray angle match over the entire sensor die 600 in accordance with one embodiment of the present teachings. (In FIG. 6, for simplicity, only the array of microlens 602 and photodiodes 604 are shown.) As shown in FIG. 6, each microlens 602 has been shifted toward the center 612 of the sensor die 600 so that each of light spots 606 is located within the corresponding photodiode 604, which improves the ray acceptance angle, and subsequently, the brightness distribution of image on the silicon die 600. The shifting of each microlens is more pronounced near sensor edges 610 and corners 608 than the center 612. As mentioned above, the shifting of each microlens is implemented by scaling a photo mask of the microlens array 602. Detailed description of shifting each microlens is disclosed in U.S. patent application Ser. No. 11/004,465, entitled "Microlens alignment procedures in CMOS image sensor design," which is hereby incorporated herein by reference in its entirety.

Figure 7A:
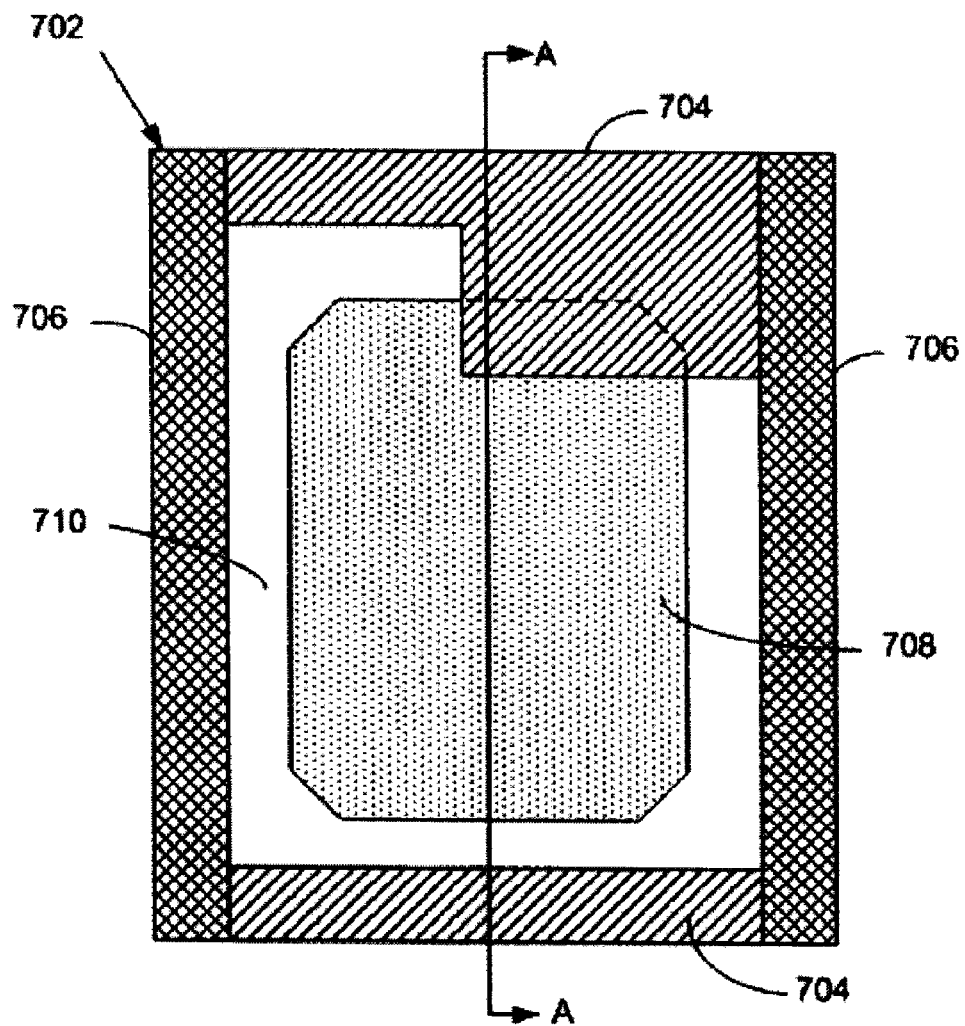
FIG. 7A is a top view of a typical pixel, where a metal layer is blocking a corner of the photodiode of each pixel.

The array shifting technique improves the non-uniformity of image intensity distribution. However, this technique, if combined with improper metal layer layout, can yield another source of non-uniformity. FIG. 7A shows a top view of a typical pixel 702, illustrating a detailed layout of metal layers 704, 706 and photodiode 708. Therein, for simplicity, only two metal layers and photodiode are shown. Metal layers 704 and 706 may be formed of an opaque material, such as aluminum, and define the shape of openings 710 through which the light rays directed to photodiode 708 are collected. As shown in FIG. 7A, the shape of the opening 710 may not be axially symmetric with respect to the axis that is surface normal and passes through the geometric center of photodiode 708.

Figure 7E:
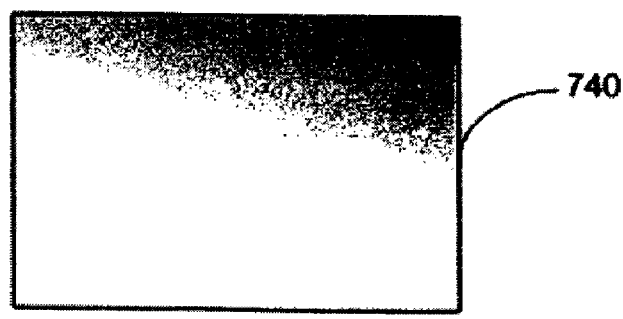
FIG. 7E is an image of a white light source captured by a typical image sensor having pixels with metal layer as shown in FIG. 7A.
Figure 7B:
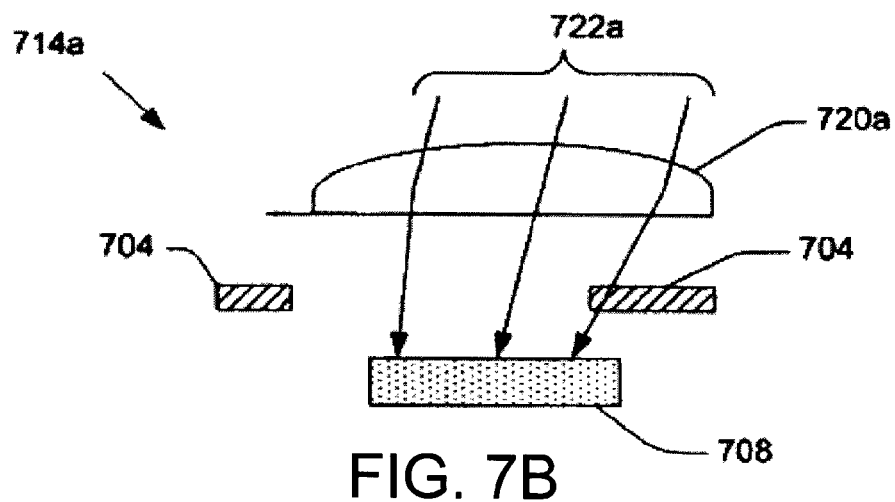
FIGS. 7B-D are cross sectional views of three pixels located at edges of a sensor die, illustrating the interference of light rays with a metal layer shown in FIG. 7A.
Figure 7C:
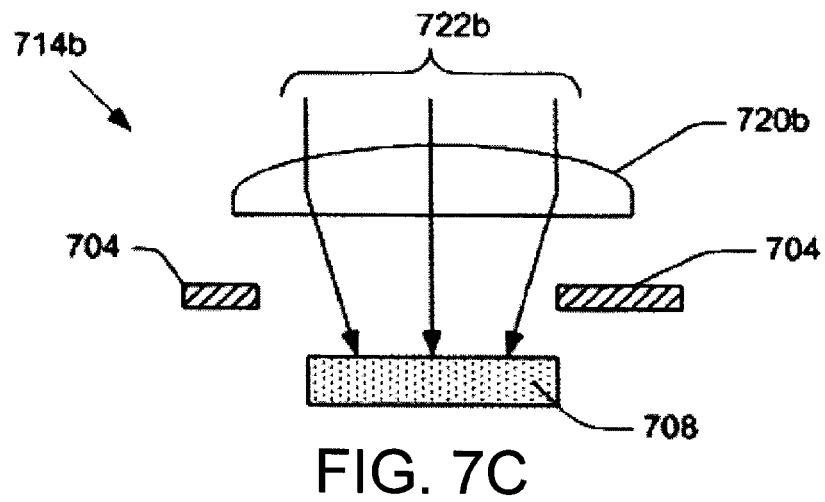
Figure 7D:
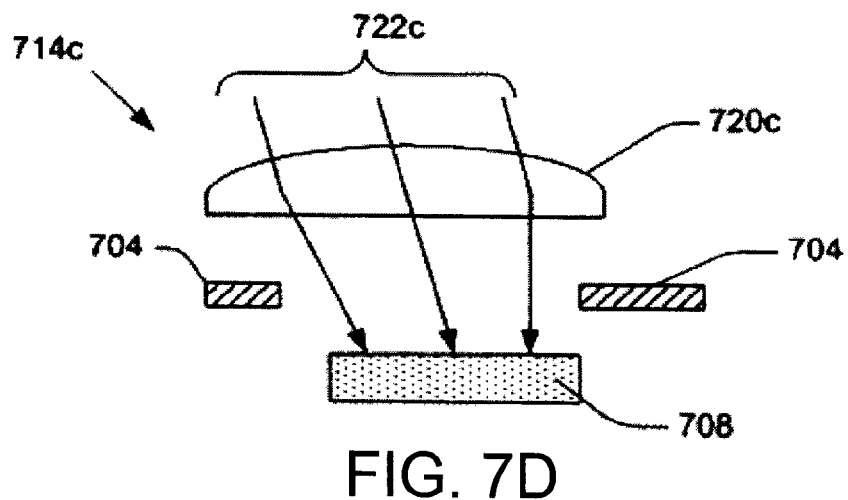

FIGS. 7B-D show cross sectional views of three pixels 714a-c located at 610a, 612, and 610c (FIG. 6), respectively, along line A-A of FIG. 7A, illustrating the interference of metal layer 704 with light rays 722a-c. As shown in FIGS. 7B-D, microlenses 720a-c have been shifted with respect to photodiode 708 to optimize the ray acceptance angle. The blockage of light by metal layer 704 is the most significant at pixel 714a and becomes less pronounced as it moves toward the pixel 714c, which results non-uniform intensity distribution of image 740 shown in FIG. 7E.

Figure 8A:
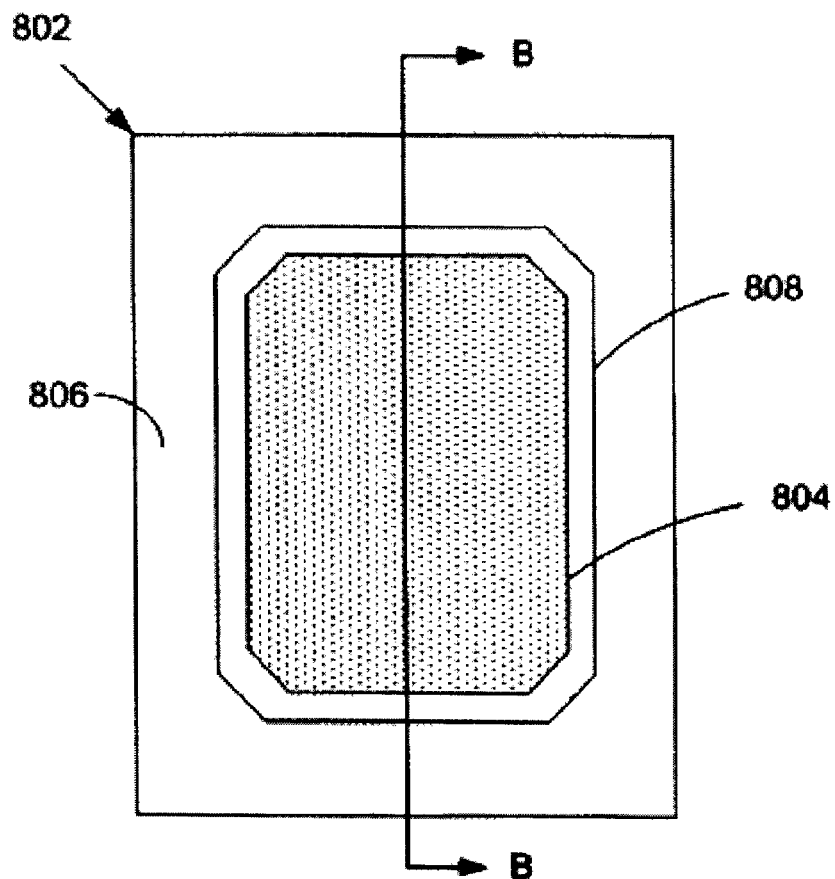
FIG. 8A is a top view of a pixel, illustrating an area where metal layers can be located without blocking optical rays collected by a photodiode of the pixel in accordance with one embodiment of the present teachings.
Figure 8B:
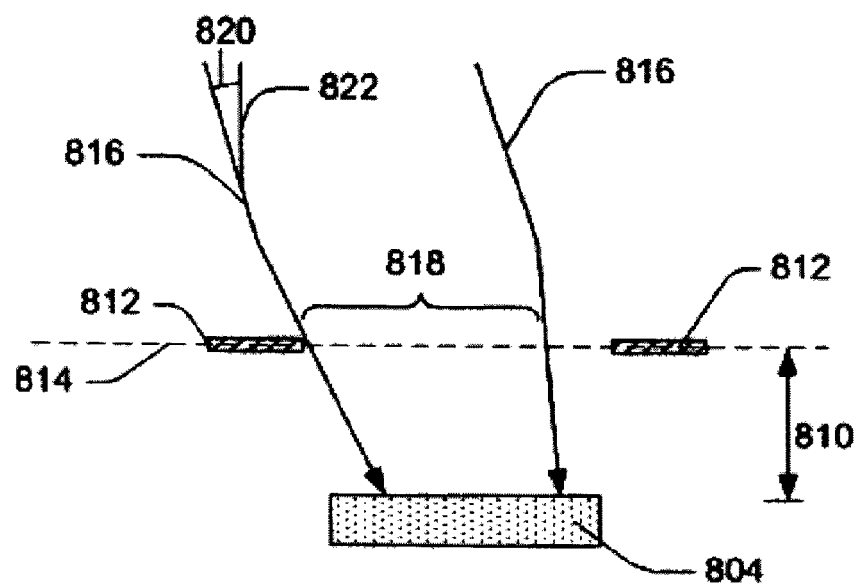
FIG. 8B is a cross sectional view of a pixel shown in FIG. 8A.

To improve the non-uniformity of image rooted in the interference of a metal layer with optical light rays, metal layer layout can be designed such that the portion of optical to light rays blocked by metal layers are minimized. FIG. 8A shows a top view of a pixel 802, illustrating photodiode 804 and an exemplary area 806 where metal layers can be located without blocking optical rays collected by the photodiode 804 in accordance with one embodiment of the present teachings. Inner boundary 808 of area 806 can be determined by conventional ray trace method as shown in FIG. 8B. FIG. 8B is a cross sectional view of an edge pixel 802 along the line B-B, where the term "edge pixel" refers to one of pixels located along four edges of a sensor die. For simplicity, microlens is not shown in FIG. 8B. Distance 810 represents the vertical interval between photodiode 804 and plane 814 defined by a metal layer 812. A portion 818 is an area where plane 814 crosses optical rays 816 collected by photodiode 804, wherein surface normal 822 makes an angle 820 with optical ray 816. Boundary 808 is defined by the edge of the area that is formed by adding portions 818 for all edge pixels.

Figure 9:
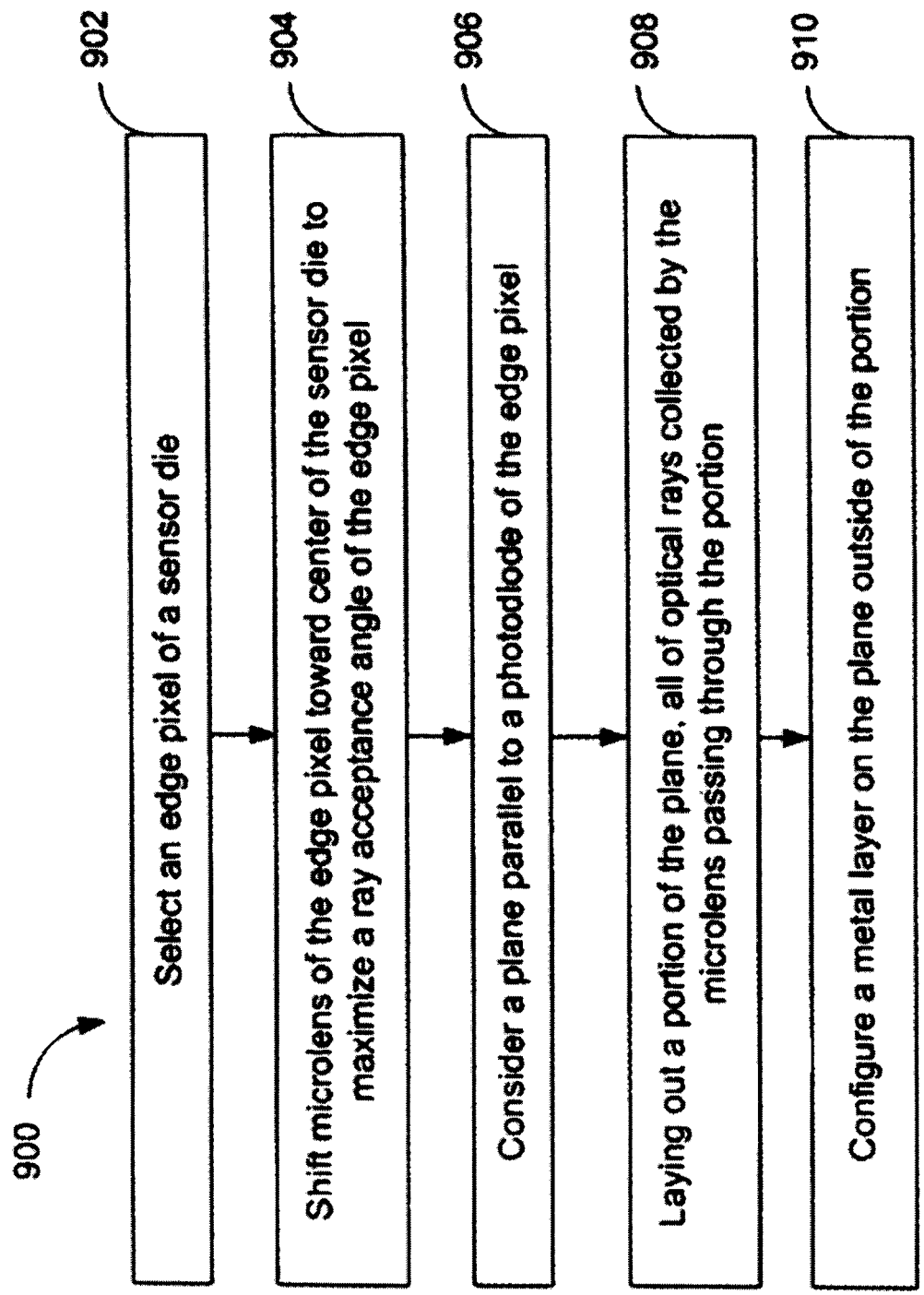
FIG. 9 shows a flow chart, illustrating exemplary steps for configuring metal layout of a pixel in a sensor die to enhance intensity uniformity of an image captured by the sensor die in accordance with one embodiment of the present teachings.

FIG. 9 shows a flow chart 900, illustrating exemplary steps for determining area where the metal layout of a pixel in a sensor die can be configured to enhance intensity uniformity of an image captured by the sensor die. At step 902, an edge pixel of the sensor die is selected. Next, at step 904, a microlens of the edge pixel is shifted toward center of the sensor die to maximize ray acceptance angle for the edge pixel. Next, a plane parallel to a photodiode of the edge pixel is considered at step 906. At step 908, a portion of the plane is laid out such that all of the optical rays collected by the microlens pass through the portion. The metal layer is configured at step 910 to be outside of the determined portion such that interference of the metal layer with optical rays is eliminated and uniformity of image intensity is enhanced.

Figure 10:
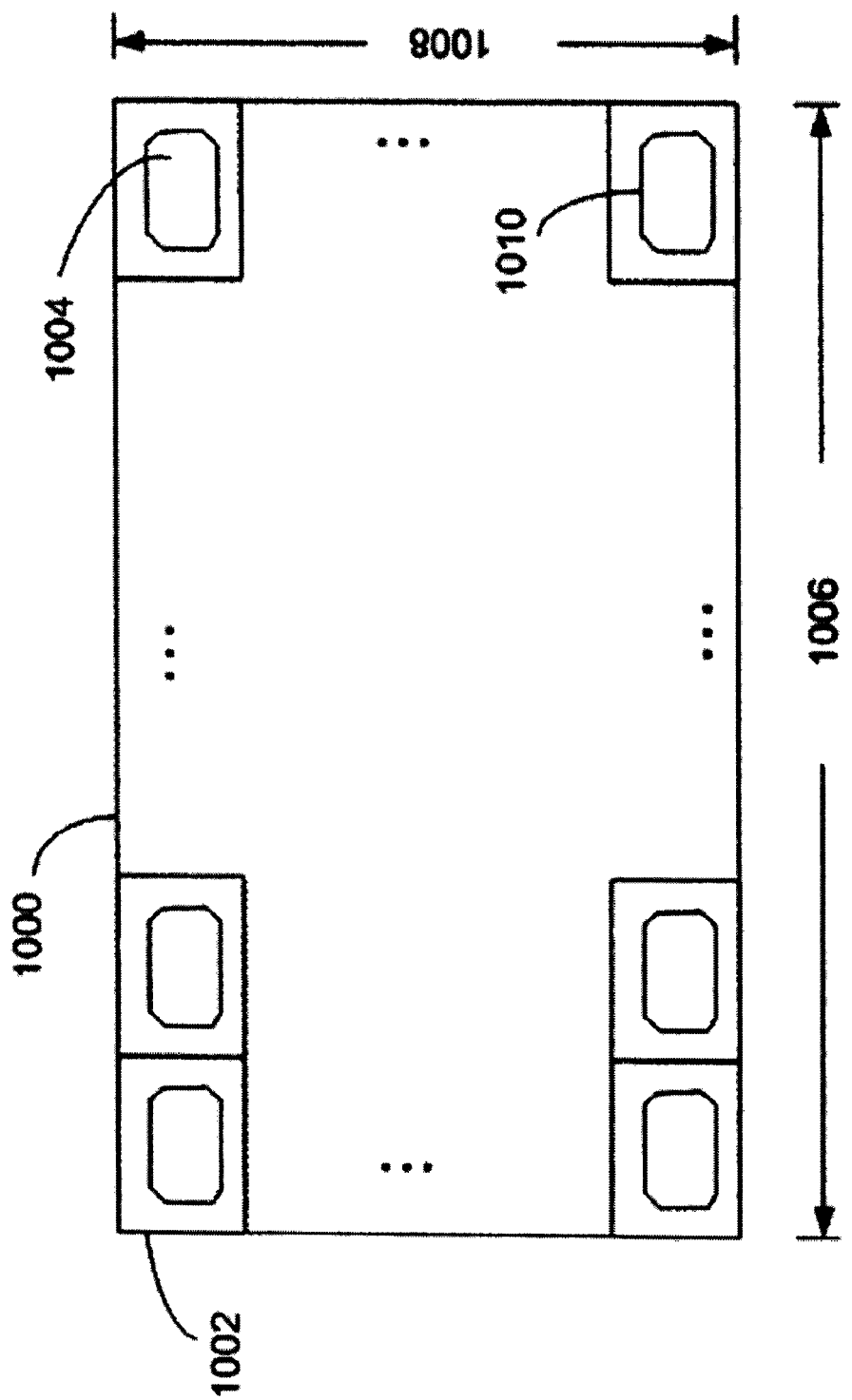
FIG. 10 shows an arrangement of identical pixels on a sensor die to minimize chief ray angles in accordance with one embodiment of the present teachings.

As the portion 818 is limited by angle 820, as shown in FIG. 8B, pixels of a sensor die can be arranged to minimize angle 820 to enhance the uniformity of image intensity. Such arrangement can also reduce non-uniformity of image pixels even with interfering metal layout. FIG. 10 illustrates an arrangement of identical pixels 1002 for a sensor die 1000 in accordance with one embodiment of the present teachings, where the photodiode of each pixel is of a polygonal shape 1004. As shown in FIG. 10, typical sensor die 1000 has width 1006 that is larger than length 1008, and pixels 1002 are arranged such that the longest side 1010 of the polygon 1004 is in parallel with width 1006. In such an arrangement, the ratio of the microlens shift for an edge pixel to its photodiode dimension is minimized, which yields the minimum of angle 820.

Figure 11A:
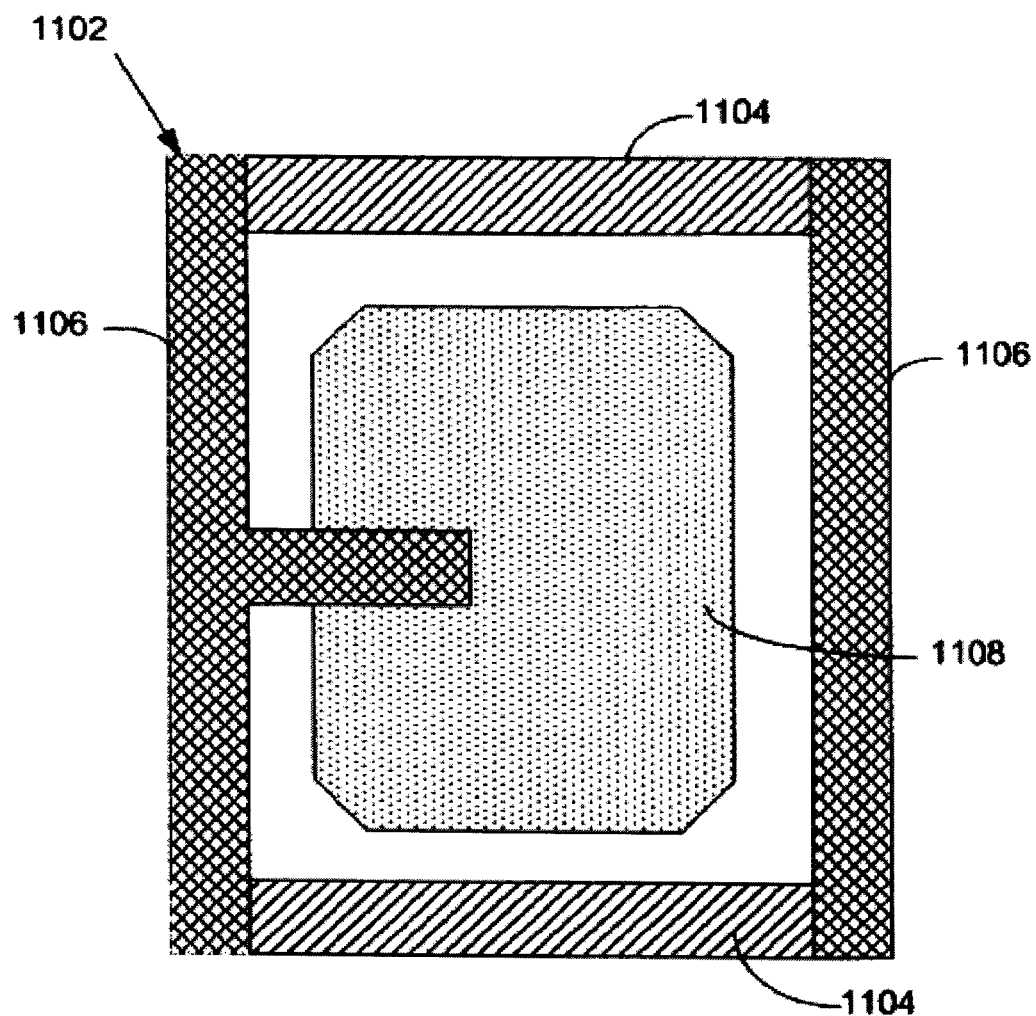
FIG. 11A is a top view of a typical pixel, where a metal layer is blocking a central portion of the photodiode of each pixel.
Figure 11B:
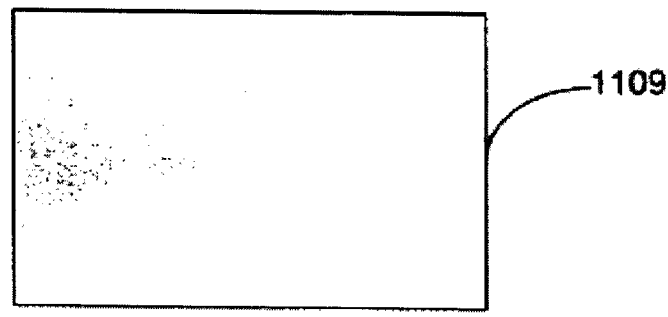
FIG. 11B is an image of a white light source captured by an image sensor having pixels with metal layer as shown in FIG. 11A.

Another approach to improve the non-uniformity rooted in the interference of a metal layer with optical light rays can be adjusting the size of image generated by a microlens. FIG. 11A is a top view of a typical pixel 1102, where a metal layer 1106 extrudes toward the center of the photodiode 1108. For simplicity, only two metal layers 1104, 1106 are shown in FIG. 11A. By the similar interference mechanism as FIG. 7A-E, the intensity of image 1109 may have non-uniformity as shown in FIG. 11B.

Figure 11C:
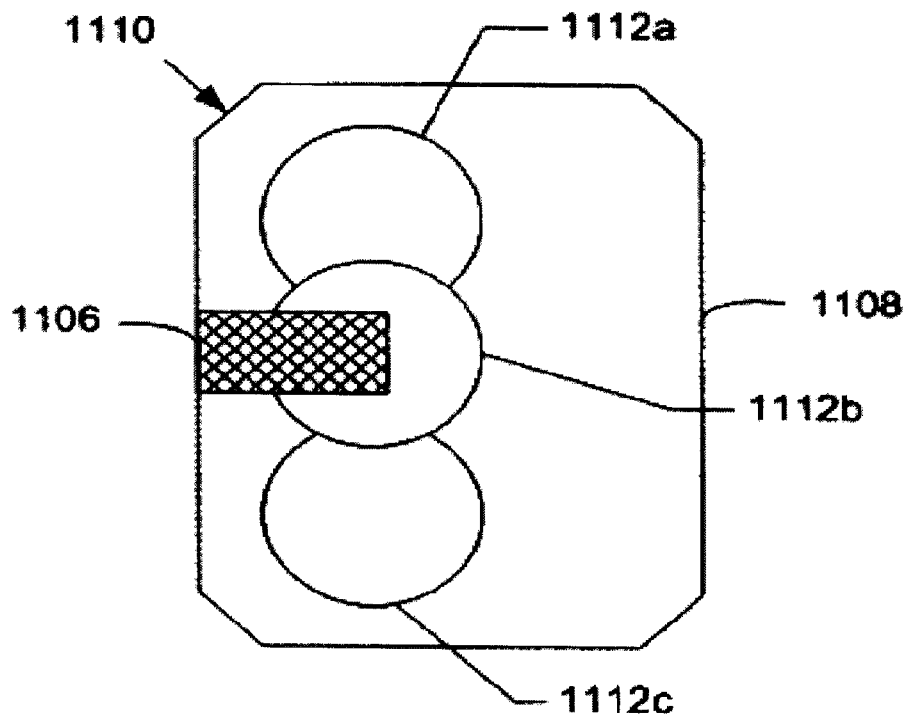
FIGS. 11C-D are top views of pixels illustrating the effect of the image size captured by each microlens on the non-uniformity shown in FIG. 11B.
Figure 11D:
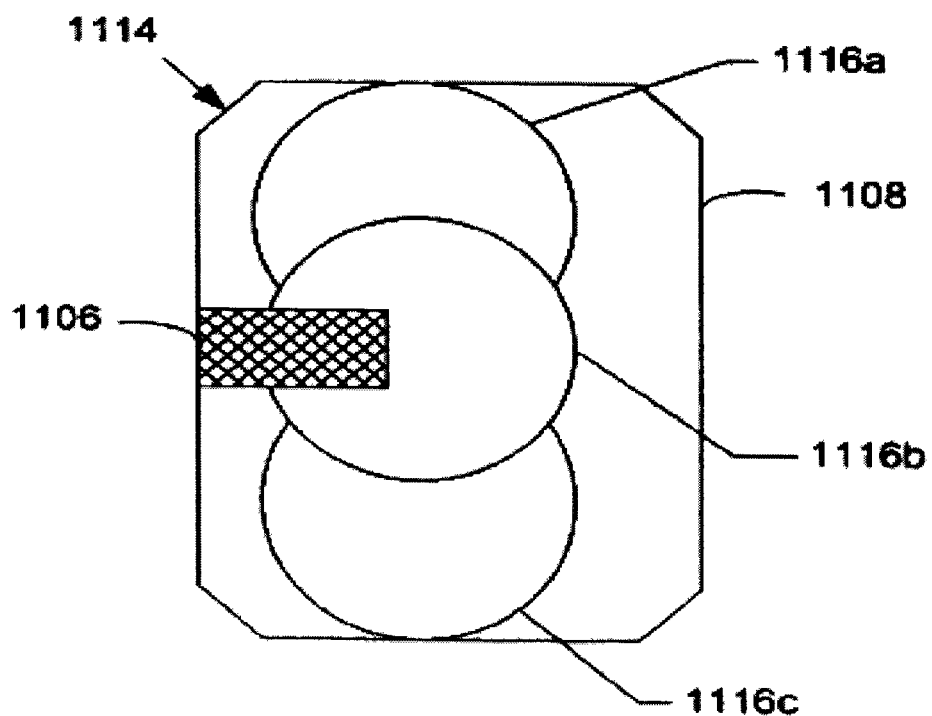

To reduce the non-uniformity, the size of the image on the photodiode 1108 can be adjusted. FIG. 11C shows a top view of a pixel 1110 illustrating a portion of the metal layer 1106 overlapped with three circles 1112a-c, where each circle corresponds to an image on the photodiode 1108 focused by a microlens in an edge pixel. FIG. 11D shows a similar top view of a pixel 1114 illustrating three circles 1116a-c that have a larger diameter than the three circles 1112a-c. As can be noticed in FIGS. 11C-D, the blocked area by the metal layer 1106 may be substantially the same for both circles 1112b and 1116b. However, the ratio of the blocked area to the circle area may be smaller in the case of the larger circle 1116b than the smaller circle 1112b, which yields less difference in intensity between the central and edge pixels. Thus, it is desirable to maximize the image on a photodiode 1108 while the entire image remains within the photodiode 1108. The size of the image 1116a-c can be controlled by the focal length of a microlens or the distance from the microlens to the photodiode. It is desirable to have a minimum distance from the microlens to the photodiode in the design to have the best efficiency. The size of the image can be controlled by microlens focal length with specific center thickness of the microlens.

Those skilled in the art will appreciate that the methods and designs described above have additional applications and that the relevant applications are not limited to those specifically recited above. It should be understood that the foregoing relates to exemplary embodiments of the invention and that modifications may be made without departing from the spirit and scope of the invention as set forth in the following claims

What is claimed is:

1. A method for arranging a plurality of pixels on a sensor die, the method comprising:
   arranging the plurality of pixels on the sensor die in a matrix form;
   arranging each pixel of the plurality of pixels such that each pixel includes a photodiode and a microlens;

arranging the plurality of pixels such that an edge microlens, corresponding to a pixel located toward an edge of the sensor die, is shifted toward a center of the sensor die with respect to a photodiode associated with the edge microlens; and arranging the plurality of pixels such that a longest dimension of the photodiode associated with the edge microlens is parallel to a longest dimension of the sensor die.

2. The method of claim 1, wherein:
each of the plurality of pixels further comprises one or more passive components; and
the photodiode and the one or more passive components are connected by metallization of a metal layer.

3. The method of claim 1, further comprising arranging the plurality of pixels such that microlenses of the plurality of pixels focus incoming light rays toward associated photodiodes through corresponding portions of a metal layer.

4. The method of claim 3, further comprising arranging the metal layer such that substantially all metallization lies outside the corresponding portions toward which the microlenses focus incoming light rays.

5. The method of claim 3, further comprising arranging the metal layer such that all the corresponding portions have the same shape and location in the respective pixels of the plurality of pixels.

6. The method of claim 3, further comprising determining a single shape and location for all the corresponding portions that prevents the metal layer from blocking the incoming light rays directed toward the photodiodes by the microlenses.

7. A computer-readable medium, having one or more sequences of instructions that, in response to being executed by one or more computing devices, cause the one or more computing devices to perform operations comprising:
arranging a plurality of pixels on a sensor die in a matrix form;
arranging each pixel of the plurality of pixels such that each pixel includes a photodiode and a microlens;
arranging the plurality of pixels such that an edge microlens, corresponding to a pixel located along toward an edge of the sensor die, is shifted toward a center of the sensor die with respect to a photodiode associated with the edge microlens; and
arranging the plurality of pixels such that a length of the photodiode that is longer than a width of the photodiode is parallel to a length of the sensor die that is longer than a width of the sensor die.

8. The computer-readable medium of claim 7, wherein:
each of the plurality of pixels further comprises one or more passive components; and
the photodiode and the one or more passive components are connected by metallization of a metal layer.

9. The computer-readable medium of claim 7, wherein the one or more sequences of instructions, in response to being executed, further result in the one or more computing devices arranging the plurality of pixels such that microlenses of the plurality of pixels focus incoming light rays toward associated photodiodes through corresponding portions of a metal layer.

10. The computer-readable medium of claim 9, wherein the one or more sequences of instructions, in response to being executed, further result in the one or more computing devices arranging the metal layer such that substantially all metallization lies outside the corresponding portions toward which the microlenses focus incoming light rays.

11. The computer-readable medium of claim 9, wherein the one or more sequences of instructions, in response to being executed, further result in the one or more computing devices arranging the metal layer such that all the corresponding portions have the same shape and location in the respective pixels of the plurality of pixels.

12. The computer-readable medium of claim 9, wherein the one or more sequences of instructions, in response to being executed, further result in the one or more computing devices determining a single shape and location for all the corresponding portions that prevents the metal layer from blocking the incoming light rays directed toward the photodiodes by the microlenses.

13. An image sensor, comprising:
a sensor die having a width dimension and a length dimension that is longer than the width dimension; and
a plurality of pixels arranged on the sensor die;
wherein each pixel of the plurality of pixels includes a microlens and a photodiode having a width dimension and a length dimension that is longer than the width dimension;
wherein an edge microlens, corresponding to a pixel located toward an edge of the sensor die, is shifted toward a center of the sensor die with respect to a photodiode associated with the edge microlens; and
wherein the length dimension of the photodiode associated with the edge microlens is parallel to the length dimension of the sensor die.

14. The image sensor of claim 13, wherein the edge microlens is configured and arranged such that an image portion formed on the associated photodiode has a maximum size while substantially remaining within the photodiode.

15. The image sensor of claim 13, wherein:
each of the plurality of pixels further comprises one or more passive components; and
the photodiode and the one or more passive components are connected by metallization of a metal layer.

16. The image sensor of claim 13, wherein the microlenses of the plurality of pixels are configured to focus incoming light rays toward associated photodiodes through corresponding portions of a metal layer.

17. The image sensor of claim 16, wherein substantially all metallization of the metal layer lies outside the corresponding portions toward which the microlenses focus incoming light rays.

18. The image sensor of claim 16, wherein all the corresponding portions of the metal layer have the same shape and location in the respective pixels of the plurality of pixels.

19. The image sensor of claim 16, wherein the corresponding portions prevent the metal layer from blocking the incoming light rays directed toward the photodiodes by the microlenses.

* * * * *